U.S. Patent Number: 5,721,443
Date of Patent: Feb. 24, 1998

NMOS FIELD EFFECT TRANSISTORS AND METHODS OF FORMING NMOS FIELD EFFECT TRANSISTORS

[75] Inventor: Jeff Zhiqiang Wu, Boise, Id.

[73] Assignee: Micron Technology, Inc., Boise, Id.

[21] Appl. No.: 802,164

[22] Filed: Feb. 13, 1997

Related U.S. Application Data

[63] Continuation of Ser. No. 502,241, Jul. 13, 1995, abandoned.

[51] Int. Cl.$^6$ .................. H01L 29/76; H01L 31/062; H01L 21/265; H01L 31/113
[52] U.S. Cl. .................. 257/344; 257/327; 437/44; 437/29
[58] Field of Search .................. 257/344, 346, 257/347, 349, 327, 623, 408; 437/29, 24, 44

[56] References Cited

U.S. PATENT DOCUMENTS

| | | | |
|---|---|---|---|
| 4,597,827 | 7/1986 | Nishitani et al. | 156/643 |
| 4,855,247 | 8/1989 | Ma et al. | 437/44 |
| 4,873,157 | 10/1989 | Flicker et al. | 429/57 |
| 4,908,326 | 3/1990 | Ma et al. | 437/44 |
| 4,954,854 | 9/1990 | Dhong et al. | 357/23.4 |
| 5,021,355 | 6/1991 | Dhong et al. | 437/35 |
| 5,028,557 | 7/1991 | Tsai et al. | 437/59 |
| 5,096,841 | 3/1992 | Miura et al. | 437/28 |
| 5,175,606 | 12/1992 | Tsai et al. | 257/320 |
| 5,208,475 | 5/1993 | Su et al. | 257/344 |
| 5,270,227 | 12/1993 | Kameyama et al. | 437/35 |
| 5,306,655 | 4/1994 | Kurimoto | 437/44 |
| 5,324,974 | 6/1994 | Liao | 257/344 |
| 5,356,826 | 10/1994 | Natsume | 437/60 |
| 5,382,533 | 1/1995 | Ahmad et al. | 437/24 |
| 5,391,906 | 2/1995 | Natsume | 257/379 |
| 5,518,945 | 5/1996 | Bracchitta et al. | 437/44 |

FOREIGN PATENT DOCUMENTS

| | | |
|---|---|---|
| 61-141180 (A) | 6/1986 | Japan. |
| 4-212466 | 8/1992 | Japan. |

OTHER PUBLICATIONS

Takeda, Eiji et al., "New Grooved–Gate MOSFET with Drain Separated from Channel Implanted Region (DSC)", IEEE Transactions On Electron Devices, vol. ED–30, No. 6, Jun. 1983, pp. 681–686.

Primary Examiner—Robert S. Tupper
Assistant Examiner—Adriana Giordana
Attorney, Agent, or Firm—Wells, St. John, Roberts, Gregory & Matkin, P.S.

[57] ABSTRACT

A semiconductor processing method of forming an NMOS field effect transistor includes, a) providing a projecting mesa of semiconductive material from a bulk semiconductor substrate, the mesa defining a semiconductor substrate floor and walls rising upwardly therefrom; b) providing a gate dielectric layer and a gate atop the semiconductive mesa; c) providing a pair of opposing LDD regions within the semiconductive mesa, the respective LDD regions running along one of the mesa walls; and d) providing source and drain diffusion regions within the bulk semiconductor substrate floor which respectively interconnect with the opposing LDD regions of the mesa. NMOS field effect transistors are also disclosed.

3 Claims, 4 Drawing Sheets

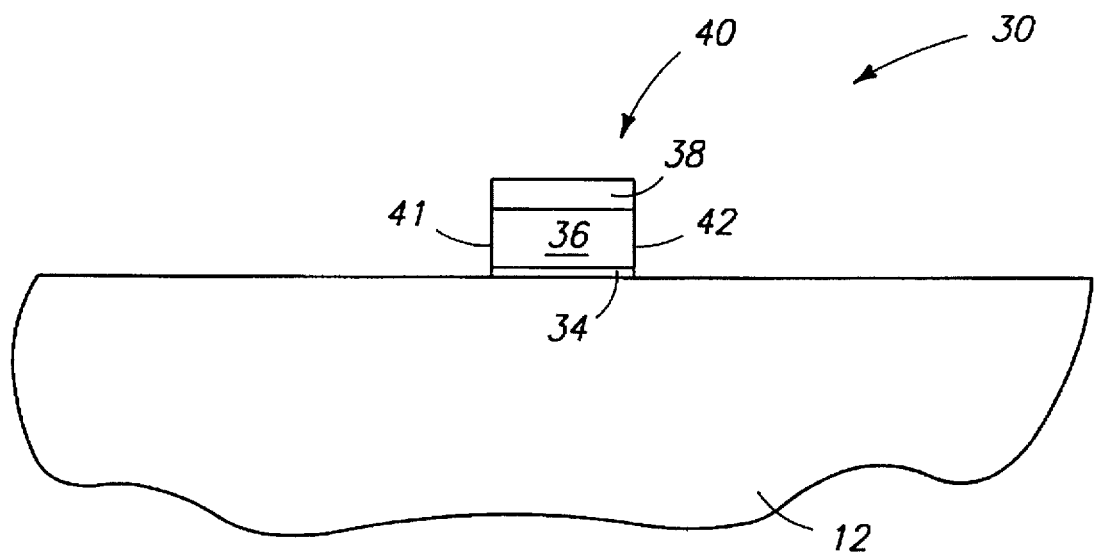
$\text{F I G} \quad 3$
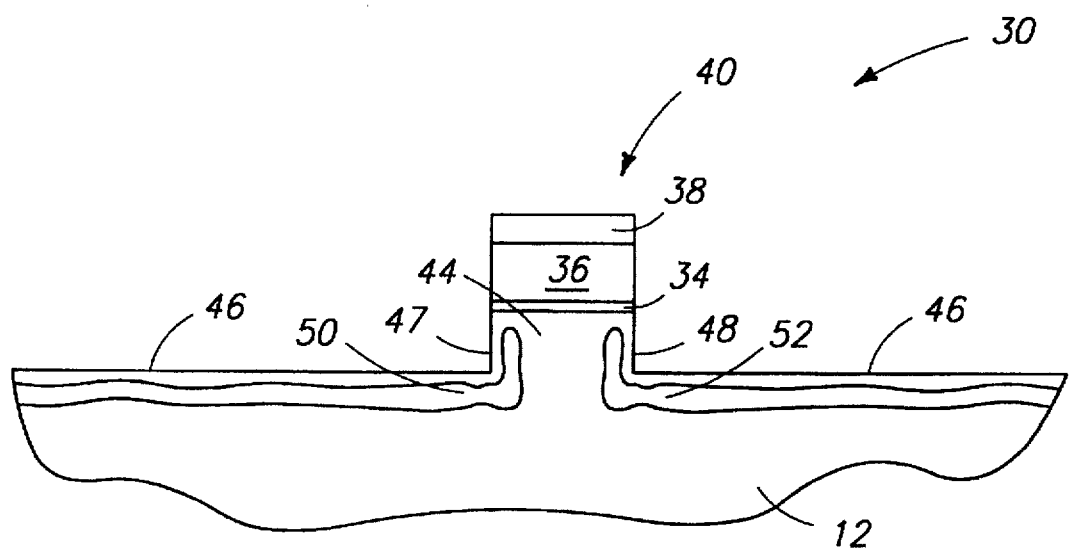
$\text{F I G} \quad 4$

NMOS FIELD EFFECT TRANSISTORS AND METHODS OF FORMING NMOS FIELD EFFECT TRANSISTORS

RELATED PATENT DATA

This application resulted from a file wrapper continuation application of U.S. application Ser. No. 08/502,241, filed on Jul. 13, 1995, now abandoned, titled "NMOS Field Effect Transistors And Methods Of Forming NMOS Field Effect Transistors", and listing Jeff Zhiqiang Wu as the inventor.

TECHNICAL FIELD

This invention relates to NMOS field effect transistors and to methods of forming NMOS field effect transistors.

BACKGROUND OF THE INVENTION

An MOS (Metal-Oxide-Semiconductor) structure in semiconductor processing is created by superimposing several layers of conducting, insulating and transistor forming materials. After a series of processing steps, a typical structure might comprise levels of diffusion, polysilicon and metal that are separated by insulating layers.

There are generally two types of MOS field-effect transistors (FETs), namely an n-type transistor (NMOS) and a p-type transistor (PMOS). These are fabricated within a semiconductor substrate, typically monocrystalline silicon, by using either negatively doped silicon that is rich in electrons or positively doped silicon that is rich in holes. Different dopant ions are utilized for doping the desired substrate regions with the desired concentration of holes or electrons. This invention is specific to NMOS transistors.

FIG. 1 illustrates a semiconductor wafer fragment 10 which depicts an NMOS field-effect transistor. Such is comprised of a bulk lightly doped p-type substrate 12 having a gate terminal 14, as well as source and drain terminals 16 and 18, respectively. Gate terminal 14 is comprised of a conductive polysilicon layer 20 and overlying higher conducting silicide layer 21. A gate oxide layer 22 is positioned intermediate polysilicon layer 20 and bulk substrate 12. Gate terminal 14 is encapsulated by electrically insulating sidewall spacers 23 and a cap 24. The bulk substrate region between source 16 and drain 18 constitutes a channel of some defined length. The source and drain regions are heavily doped with n-type material. Application of an input voltage to gate terminal 14 sets up a transverse electric field in the channel region. By varying this transverse electric field, it is possible to modulate the longitudinal conductance of the channel region.

As MOS channel lengths (i.e., gate widths) got smaller than about 3 microns, so-called short-channel effects began to become increasingly significant. As a result, device design and consequently process technology had to be modified to take these effects into account so that optimum device performance could continue to be obtained. For example as device dimensions are reduced and the supply voltage remains constant, the lateral electric field generated in MOS devices increases. If the field becomes strong enough, it can give rise to so-called hot-carrier effects in MOS devices. This becomes a significant problem in NMOS devices with channel lengths smaller than 1.5 microns. Hot-carrier effects cause unacceptable performance degradation in NMOS devices built with conventional drain structures if their channel lengths are less than 2 microns.

A preferred method of overcoming this problem is to provide the illustrated lightly doped drain regions 25 relative to the channel region in advance of the source and drain regions. The LDD regions are provided to be lighter doped (i.e., less concentration) than the source and drain regions. This facilitates sharing of the voltage drop by the drain and the channel, as opposed to the stark voltage drop at the channel occurring in non-LDD NMOS devices. The LDD regions absorb some of the voltage drop potential into the drain, thus effectively eliminating hot carrier effects. As a result, the stability of the device is greatly increased.

However, further shrinking of the NMOSFET width (i.e., shorter channel length) makes the LDD region of a conventional NMOS LDD transistor less effective because of reduced LDD length. It would be desirable to develop alternate methods and structures which accommodate reduced intrinsic channel length the result of tighter integration densities.

BRIEF DESCRIPTION OF THE DRAWINGS

Preferred embodiments of the invention are described below with reference to the following accompanying drawings.

FIG. 3 is a view of the FIG. 2 wafer fragment at a processing step subsequent to that shown by FIG. 2.

FIG. 4 is a view of the FIG. 2 wafer fragment at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an NMOS field effect transistor comprises the following steps:

providing a projecting mesa of semiconductive material from a bulk semiconductor substrate, the mesa defining a semiconductor substrate floor and walls rising upwardly therefrom;

providing a gate dielectric layer and a gate atop the semiconductive mesa;

providing a pair of opposing LDD regions within the semiconductive mesa, the respective LDD regions running along one of the mesa walls; and providing source and drain diffusion regions within the bulk semiconductor substrate floor which respectively interconnect with the opposing LDD regions of the mesa.

In accordance with a narrower and more preferred aspect of the invention, a semiconductor processing method of forming an NMOS field effect transistor comprises the following steps:

providing a bulk substrate of semiconductive material, the substrate having a substantially planar upper surface;

providing a patterned gate over the semiconductor substrate, the gate having opposing sidewalls;

etching into the bulk semiconductor substrate to define a mesa of semiconductive material, the mesa defining a semiconductive floor and substantially vertical walls rising upwardly therefrom, the patterned gate being received atop the semiconductive mesa;

doping n-type conductivity enhancing impurity into both the mesa walls and the semiconductive floor to form a pair of opposing continuous, elongated and angled LDD regions; the respective LDD regions having a first portion running along one of the mesa walls and a second portion running along the semiconductor substrate floor;

providing a layer of electrically insulative material over the gate sidewalls and over the mesa sidewalls, the layer of insulating material covering the first and the second portions of the LDD regions; and after providing the electrically insulative material over the gate and mesa sidewalls, doping n-type conductivity enhancing impurity into the bulk substrate floor to form source and drain diffusion regions within the bulk substrate floor which respectively interconnect with the opposing, continuous, elongated, and angled LDD regions extending from the mesa; the electrically insulative layer substantially masking the LDD regions from the source and drain doping.

The invention also contemplates field effect transistors as will be appreciated from the following discussion.

Figure 1:
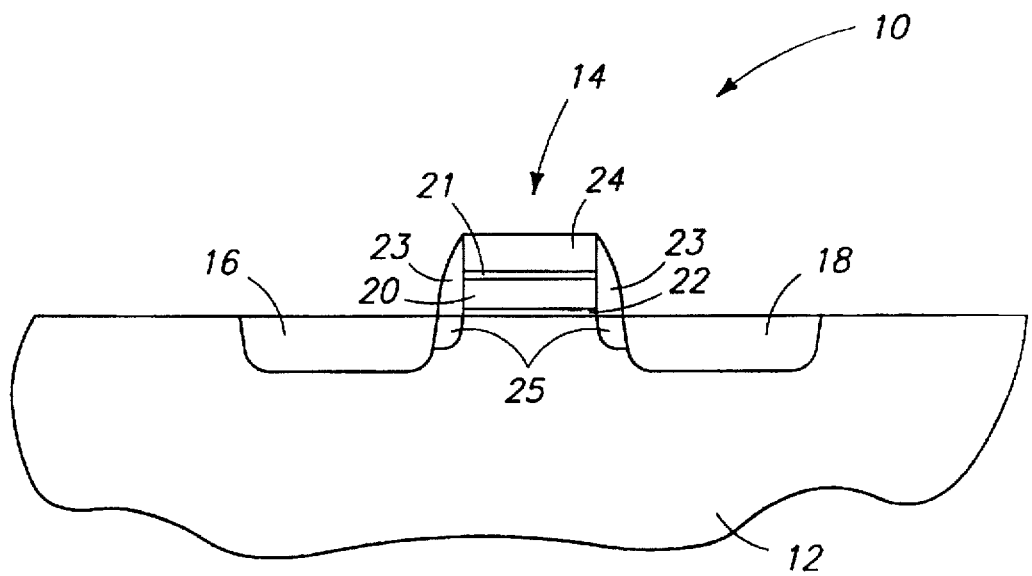
FIG. 1 is a diagrammatic sectional view of a prior art semiconductor wafer fragment and is discussed in the "Background" section above.
Figure 2:
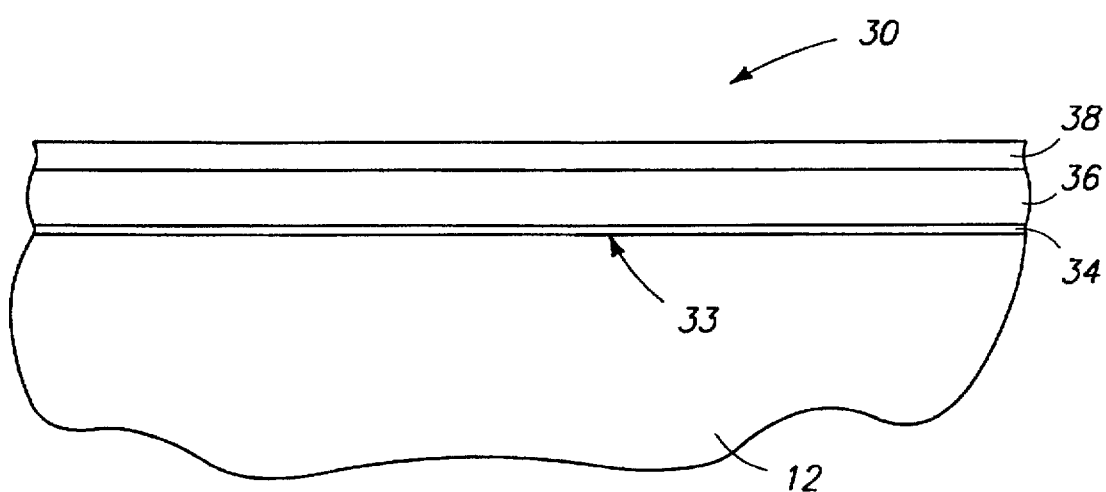
FIG. 2 is a diagrammatic sectional view of a semiconductor wafer fragment at one processing step in accordance with the invention.

Referring first to FIG. 2, a semiconductor wafer fragment in process is indicated generally with reference numeral 30. Such comprises a bulk substrate 12 of semiconductor material, typically p-doped monocrystalline silicon. Bulk substrate 12 has a planar upper surface 33. A gate oxide layer 34, a gate layer 36 and a nitride capping layer 38 are provided as shown. Layer 34 would typically and preferably comprise $SiO_2$, layer 36 would comprise a composite of polysilicon and a silicide, and nitride capping layer 38 would comprise $Si_3N_4$.

Referring to FIG. 3, layers 38, 36 and 34 are patterned to define a gate 40 over semiconductor substrate 12. For purposes of the continuing discussion, gate 40 includes opposing sidewalls 41 and 42.

Referring to FIG. 4, bulk silicon semiconductor substrate 12 is etched into to define a mesa 44. An example preferred range for trenching into silicon substrate 12 is from 200 Angstroms to 300 Angstroms. After etching, substrate 12 defines a bulk substrate semiconductive floor 46, and mesa 44 comprises opposing mesa walls 47 and 48. Such mesa walls are provided to be substantially perpendicular relative to substrate floor 46. Patterned gate 40 is received atop mesa 44. Such comprises a preferred embodiment of providing a projecting mesa of semiconductive material from bulk semiconductor substrate 12, having a gate 40 provided thereatop.

A pair of opposing boron halo implants 50 and 52 are provided into mesa walls 47, 48 and substrate floor 46. Such constitute a preferred and prior art known punch through prevention implant in conjunction with standard NMOS field effect transistors. Preferably, such implant is conducted to be an angled implant at, for example, 30° to provide the implant within the mesa as well as along the substrate floor. An example total boron dose for such implant is $4\times10^{12}$ ions/cm$^2$ at an energy of 40 eV to produce a resultant peak concentration of $1\times10^{18}$ ions/cm$^3$ of p-type material.

Figure 5:
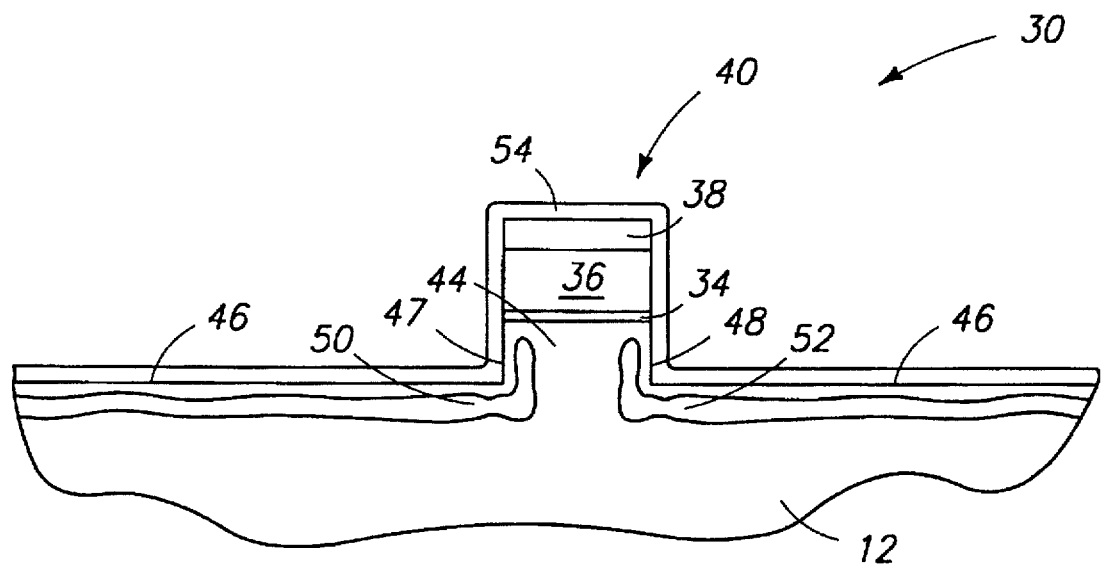
FIG. 5 is a view of the FIG. 2 wafer fragment at a processing step subsequent to that shown by FIG. 4.

Referring to FIG. 5, a layer 54 of phosphosilicate glass (PSG) is deposited as shown over mesa walls 47, 48 and substrate floor 46. An example and preferred thickness is 300 Angstroms, with an example and preferred phosphorous concentration in layer 54 being $1\times10^{20}$ ions/cm$^3$.

Figure 6:
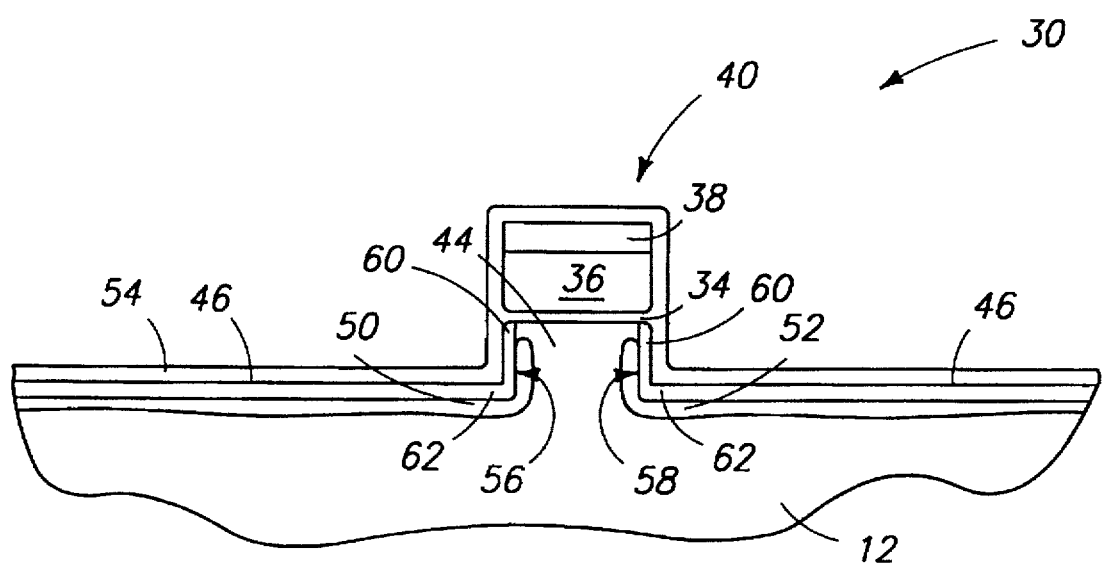
FIG. 6 is a view of the FIG. 2 wafer fragment at a processing step subsequent to that shown by FIG. 5.

Referring to FIG. 6, the substrate is subjected to conditions effective to out-diffuse phosphorous from phosphosilicate glass layer 54 into mesa walls 47, 48 and substrate floor 46 to provide a pair of opposing LDD regions 56 and 58 within mesa 44. An example and preferred technique is to expose the wafer to 900° C. at 760 Torr for 15 minutes in an $O_2$ ambient. Such will have the combined effect of both driving phosphorous atoms from layer 54 to form LDD regions 56 and 58, and also result in underlying oxidation of the substrate which has the effect of smoothing the corners of the interface between word line 40 and mesa 44. Such will also have the effect of slightly increasing the thickness of layer 54. The resultant and example preferred peak concentration of phosphorous (n-type material) within LDD regions 56 and 58 is $1\times10^{18}$ ions/cm$^3$. Thermal treatment of the substrate also has the ultimate effect of diffusing boron halo implants 50 and 52 as shown.

LDD regions 56 and 58 have a respective first portion 60 running along one of mesa walls 47, 48, and a respective second portion 62 running along semiconductor substrate floor 46. The first and second portions of the respective LDD regions are interconnected to form respective elongated and angled LDD regions extending from the mesa into the bulk semiconductor substrate. In the illustrated and preferred embodiment, the LDD regions are effectively continuous and angled at 90°. LDD regions/layer 62 could of course be provided by alternate means, such as by an appropriate angled ion implant.

Figure 7:
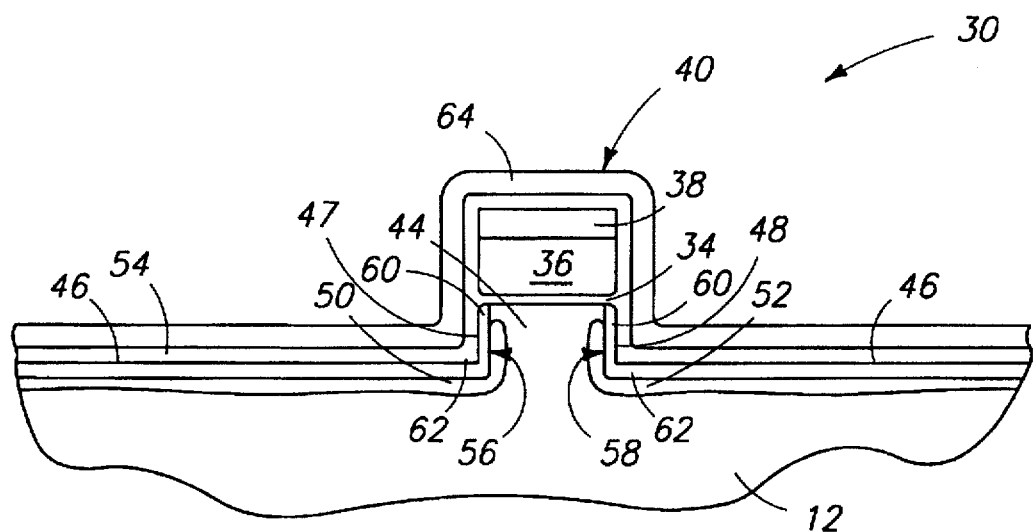
FIG. 7 is a view of the FIG. 2 wafer fragment at a processing step subsequent to that shown by FIG. 6.

Referring to FIG. 7, an insulative layer 64 is deposited over phosphosilicate glass layer 54. An example and preferred material is $Si_3N_4$ deposited to a thickness of 1,000 Angstroms. Thus, layers 54 and 64 comprise a composite layer of electrically insulative material provided over gate sidewalls 41, 42 and mesa sidewalls 47, 48, with such insulating material layer covering both first and second portions 60 and 62, respectively, of LDD regions 56 and 58.

Figure 8:
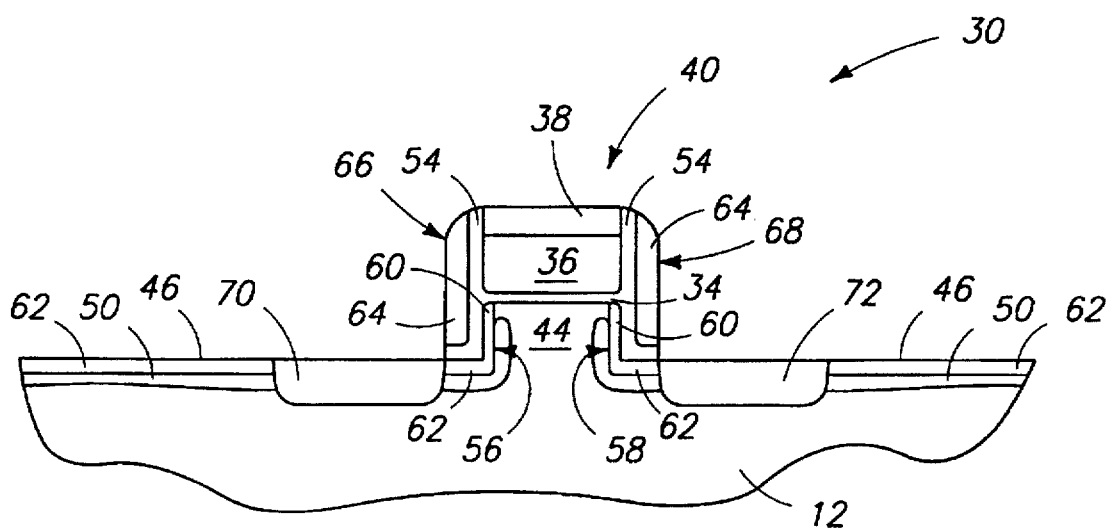
FIG. 8 is a view of the FIG. 2 wafer fragment at a processing step subsequent to that shown by FIG. 7.

Referring to FIG. 8, nitride layer 64 is anisotropically etched, followed by anisotropic etching of phosphosilicate glass layer 54 to form an opposing pair of electrically insulative composite phosphosilicate glass/nitride spacers 66 and 68. An example chemistry for etching nitride layer 64 utilizes $NF_3$ and HBr plasma. An example chemistry for etching the preferred PSG of layer 54 includes $CF_3$ plasma. Accordingly, spacers 66 and 68 cover second portions 62 of LDD regions 56 and 58. Subsequently, ion implanting is conducted into substrate floor 46 with an n-type impurity using composite spacers 66 and 68 to substantially mask LDD regions 56 and 58 from the ion implanting. The result is formation of source and drain regions 70 and 72. Such source and drain regions respectively interconnect with the opposing angled LDD regions which extend from the mesa. Composite spacers 66 and 68 effectively constitute an electrically insulative layer which substantially masks the illustrated horizontal portions of the LDD regions from the source and drain doping. Such ion implantation to produce source and drain regions 70 and 72 could also be conducted prior to or in the midst of the preferred deposition of layer 64 and anisotropic etching to produce composite spacers 66 and 68.

The above described preferred process produces LDD regions which extend along both the substantially vertical mesa sidewalls and along a portion of the horizontal upper surface of bulk substrate 12. Also contemplated is provision of opposing LDD regions within the mesa which do not necessarily include a portion extending horizontally along the substrate floor. Some form of floor masking would typically be utilized in such instance for the LDD implanting. Regardless, the result is a longer effective LDD region to provide lower peak electric field. The n+ source/drain regions are further away from the gate which reduces undesired hot electron injection into the gate. The preferred process also preserves formation of a planar gate oxide, which does not occur in prior art grooved channel approaches. The resultant structure also facilitates better controlled drain to gate overlap.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming an NMOS field effect transistor comprising the following steps:

forming a patterned gate over a semiconductor substrate, the gate having opposing sidewalls;

etching into the semiconductor substrate to define a mesa of semiconductive material beneath the patterned gate; after the etching, the substrate defining a semiconductive substrate floor and the mesa comprising opposing, substantially vertical wall sections rising upwardly from the floor;

forming a pair of opposing halo implants within the mesa wall sections and substrate floor;

after forming the pair of opposing halo implants, forming a pair of opposing LDD regions within the semiconductive mesa, the respective LDD regions having a first portion running along one of the mesa wall sections and a second portion running along the semiconductor substrate floor, the first and second portions of the respective LDD regions being interconnected to form respective elongated and angled LDD regions extending from the mesa into the bulk semiconductor substrate; the step of forming the pair of opposing LDD regions comprising:

depositing a layer of phosphosilicate glass over the mesa wall sections and substrate floor, the layer of phosphosilicate glass lying conformally over the mesa wall sections and substrate floor: and subjecting the substrate to conditions effective to out-diffuse phosphorus from the phosphosilicate glass layer into the mesa wall sections and the substrate floor forming a layer of electrically insulative material over the gate sidewalls and over the mesa wall sections, the layer of insulating material covering the first and the second portions of the LDD regions and comprising nitride; and after forming the electrically insulative material over the gate sidewalls and mesa wall sections, doping n-type conductivity enhancing impurity into the bulk substrate floor to form source and drain diffusion regions within the floor which respectively interconnect with the opposing, continuous, elongated, and angled LDD regions extending from the mesa; the electrically insulative layer substantially masking the LDD regions from the source and drain doping.

2. The semiconductor processing method of forming an NMOS transistor of claim 1 wherein the mesa wall sections are formed to be substantially perpendicular to the substrate floor.

3. The semiconductor processing method of forming an NMOS transistor of claim 1 wherein the mesa wall sections are formed to be substantially perpendicular to the substrate floor, and wherein the pair of opposing halo implants comprise boron.

* * * * *